United States Patent
O'Driscoll et al.

(10) Patent No.: US 10,827,589 B2
(45) Date of Patent: Nov. 3, 2020

(54) MULTIPLE INPUT TOUCH DIMMER LIGHTING CONTROL

(71) Applicant: BRIGHTGREEN PTY LTD, Richmond South (AU)

(72) Inventors: David O'Driscoll, Collingwood (AU); Moffat Nathan, Hawthorn (AU); Trent Carter, Richmond (AU)

(73) Assignee: BRIGHTGREEN PTY LTD, Cremorne (AU)

(*) Notice: Subject to any disclaimer, the term of this patent is extended or adjusted under 35 U.S.C. 154(b) by 0 days.

(21) Appl. No.: 15/749,088

(22) PCT Filed: Aug. 1, 2016

(86) PCT No.: PCT/IB2016/054608
§ 371 (c)(1),
(2) Date: Jan. 30, 2018

(87) PCT Pub. No.: WO2017/017665
PCT Pub. Date: Feb. 2, 2017

(65) Prior Publication Data
US 2018/0228003 A1 Aug. 9, 2018

(30) Foreign Application Priority Data

Jul. 30, 2015 (AU) .............................. 2015903033

(51) Int. Cl.
*H05B 37/02* (2006.01)
*H05B 47/105* (2020.01)
(Continued)

(52) U.S. Cl.
CPC ........... *H05B 47/105* (2020.01); *G05B 11/01* (2013.01); *G05B 15/02* (2013.01); *G06F 3/03547* (2013.01); *G06F 3/04883* (2013.01); *H05B 47/11* (2020.01); *H05B 47/19* (2020.01); *G05B 2219/13031* (2013.01); *G05B 2219/2613* (2013.01); *G05B 2219/2642* (2013.01); *G05B 2219/2664* (2013.01); *G06F 3/0488* (2013.01); *G08B 13/19619* (2013.01);
(Continued)

(58) Field of Classification Search
CPC ............ H05B 37/0218; H05B 37/0272; H05B 39/088; H05B 47/11; H05B 47/19; H03K 17/96; G06F 3/0488; G05B 11/01; G05B 15/02
USPC .................................................. 315/149, 308
See application file for complete search history.

(56) References Cited

U.S. PATENT DOCUMENTS

2006/0161270 A1* 7/2006 Luskin .................... G05B 15/02
700/22
2010/0225241 A1* 9/2010 Maehara .............. H05B 33/086
315/250
(Continued)

*Primary Examiner* — Thuy Vinh Tran
(74) *Attorney, Agent, or Firm* — Maschoff Brennan

(57) ABSTRACT

The invention relates to a touch panel device for a dimmer lighting control system and a method for controlling a light circuit. The device comprises a touch sensitive surface; a light sensor; a motion sensor and a processor operatively connected to the touch sensitive surface, the light sensor, the motion sensor for generating control signal. The processor is configured for modifying the control signal based on a learning from a stored historical data in a secondary device, accepting or rejecting a device operation using a user input.

14 Claims, 10 Drawing Sheets

(51) Int. Cl.
*G06F 3/0488* (2013.01)
*G06F 3/0354* (2013.01)
*H05B 47/11* (2020.01)
*H05B 47/19* (2020.01)
*G05B 11/01* (2006.01)
*G05B 15/02* (2006.01)
G08B 13/196 (2006.01)
H03K 17/96 (2006.01)

(52) U.S. Cl.
CPC ........ *G08B 13/19695* (2013.01); *H03K 17/96* (2013.01); *Y02B 20/46* (2013.01)

(56) References Cited

U.S. PATENT DOCUMENTS

| | | | | |
|---|---|---|---|---|
| 2011/0112702 | A1* | 5/2011 | Huizenga | G05B 15/02 700/295 |
| 2015/0256355 | A1* | 9/2015 | Pera | H04L 12/2803 700/90 |

\* cited by examiner

Figure 5 - Flowchart for manual commands within the active touch area

Figure 6 - Flowchart for manual commands within the toggle switch area

Figure 7 - Flowchart for autonomously adjusting brightness based on ambient light level Figure 8 - Flowchart for autonomously adjusting state or brightness of circuit based on motion Figure 9 - Flowchart for predicting when to execute an operation and improving predictive accuracy

MULTIPLE INPUT TOUCH DIMMER LIGHTING CONTROL

FIELD OF THE INVENTION

The present invention relates to a multiple input lighting control system and method and relates particularly to a touch dimmer lighting control system and method which is able to determine and control the desired light levels of an area in response to one or more factors.

Patent of Addition

This application is for an improvement or modification to the invention disclosed in co-pending Australian patent application No 2012325685 filed on 12 Oct. 2012.

BACKGROUND TO THE INVENTION

Touch dimmer lighting control systems are known in the art which employ a touch panel to vary the brightness of a single light circuit. The touch panel replaces a conventional light switch and rotary dimmer control knob. For example, US Patent Application No 2010/0301682 by Huang, filed 2 Dec. 2010, describes a feather-touch dimming switch which comprises an enclosure having a mounting surface, a flat plate button mounted on the mounting surface, a dimming button, a tripping button, a dimmer mounted inside the enclosure, a resetting/tripping device, and a dimming control circuit. The device of Huang is used to switch the power ON/OFF to a single light circuit and/or to dim the light by controlling the power supplied to the light circuit.

U.S. Pat. No. 7,566,996 issued on 28 Jul. 2009 to Altonen and Spira, discloses a touch dimmer that comprises a face plate having a planar front surface with an opening through which a bezel with a touch sensitive surface extends. The front surface of the bezel is positioned immediately above a touch sensitive device which is actuated by a user touching the front surface of the bezel. Actuation of the lower portion of the front surface causes a single lighting load to be switched ON/OFF. Actuation of the upper portion of the front surface causes the intensity of the lighting load to change.

Commonly owned Australian patent application No 2012325685 discloses a touch panel device 12 for a dimmer lighting control system 10, the device 12 comprising a touch sensitive surface 14 capable of detecting movement of a finger or fingers in first and second directions, and a processor 16 for generating first and second control signals respectively based on this detection. In use, the balance of the load between first and second light circuits and a total light output of both light circuits can be controlled with the same touch panel device 12.

Prior art touch dimmers have tended to duplicate the controls provided by a conventional mechanical switch and rotary dimmer. The present invention was developed with a view to providing a multiple input touch dimmer lighting control system and method which further expands the functionality of a touch dimmer beyond that of conventional mechanical light switches and rotary dimmers.

References to prior art in this specification are provided for illustrative purposes only and are not to be taken as an admission that such prior art is part of the common general knowledge in Australia or elsewhere.

SUMMARY OF THE INVENTION

According to one aspect of the present invention there is provided a touch panel device for a dimmer lighting control system, the device comprising:

a touch sensitive surface capable of detecting a touch input;

a light sensor that detects ambient light levels within a sensing area adjacent to the device;

a processor operatively connected to the touch sensitive surface and the light sensor for generating control signals based on detection of a touch input on the touch sensitive surface and/or ambient light levels wherein, in use, the total light output of a light circuit can be controlled manually with the touch panel device and/or controlled autonomously by the level of ambient light in the sensing area.

Preferably the touch panel device further comprises:

a movement sensor operatively connected to the processor that detects movement in the sensing area over a wide angle adjacent to a mounting surface of the device wherein, in use, if an object enters or leaves the sensing area then, for example, the light circuit is automatically switched ON or OFF.

Preferably the movement sensor also detects when a moving object is proximate to the touch panel device and if the object is within close proximity to the device then, for example, the touch sensitive surface is illuminated so as to be easier to locate and operate in the dark.

Preferably the touch panel device further comprises:

a wireless communications module and antenna operatively connected to the processor for receiving and transmitting data on a wireless network wherein, in use, the device can be connected to a central HUB for home automation.

In another embodiment the touch panel device further comprises an image producing apparatus operatively connected to the processor. Preferably the image producing apparatus is a visible light video camera. Advantageously the touch panel device further comprises an infrared light emitter. Advantageously the video camera is capable of rapidly recognising and tracking movement of non-regular objects within the imaging area to execute an if, then/else operation. Preferably the image producing apparatus is provided integral with the light sensor that measures ambient light levels. Preferably the image producing apparatus is provided integral with a motion sensor that detects movement. Advantageously the video camera enables video surveillance of the sensing area wherein, in use, the device can be used as a security camera and/or for remote monitoring for home automation.

Preferably the touch sensitive surface is capable of detecting movement of a touch input in first and second directions. Preferably the touch sensitive surface is capable of detecting movement of a touch input in a horizontal direction (X axis) and a vertical direction (Y axis). Typically the control signals generated by the processor are based on a combination of the detected movement of the touch input on the touch sensitive surface in the X and Y directions. Preferably vertical movement of the touch input in the direction of the Y axis results in the generation of a control signal that varies the power to at least one light circuit so as to vary the brightness. Preferably horizontal movement of a touch input in the direction of the X axis results in the generation of a control signal that varies the power to at least one light circuit so as to vary the colour temperature.

Advantageously wireless credentials related to a wireless network formed by a wireless network access point, are wirelessly transmitted to the touch panel device. Preferably the wireless module and antenna are configured for a WiFi protocol. Preferably the data from at least one sensor is transmitted and stored on a secondary device connected to the wireless network.

Preferably the touch panel device further comprises a channel selection circuit for switching a controlling state of at least one light circuit between active and inactive. Preferably an interface of the channel selection circuit is integral with the touch sensitive surface. Typically the channel selection circuit comprises three touch toggle switches.

Preferably a balance of the load between first and second light circuits and total light output of both circuits can be controlled remotely via a secondary electronic device.

Preferably the wireless communications module and antenna are capable of wireless repeating. Preferably a plurality of like touch panel devices can be linked through a secondary electronic device such that linked touch panel devices control all circuits as a single circuit.

According to another aspect of the present invention there is provided a touch dimmer lighting control method, responsive to a touch panel device, for controlling a light circuit, the method comprising the steps of:
 detecting a touch input on a touch sensitive surface of the touch panel device;
 detecting ambient light levels within a sensing area adjacent to the touch panel device; and,
 generating control signals based on detection of a touch input on the touch sensitive surface and/or ambient light levels wherein, in use, the total light output of the light circuit can be controlled manually with the touch panel device and/or controlled autonomously by the level of ambient light in the sensing area to achieve a desired light level in the sensing area.

Preferably the touch dimmer control method further comprises the step of: detecting a time duration a touch input remains stationary on the touch sensitive surface. Advantageously the touch dimmer control method further comprises the step of: detecting a time difference between a previous tap and a current tap of at least one touch input. Preferably the touch dimmer control method further comprises the step of: detecting a location of at least one touch input on the touch sensitive surface. Typically the touch dimmer control method further comprises the step of: detecting a plurality of simultaneous touch inputs on the touch sensitive surface.

Preferably the ambient light levels in the sensing area are detected in a manner such that localised high or low light intensity values are identified and ignored. Typically a desired light level in the sensing area is determined by one or more factors including ambient light levels, motion within the sensing area, input functionality or additional input characteristics. Advantageously a desired light level is controlled automatically in a manner such that circuit brightness adjustments are carried out at a frequency desirable to the user.

Preferably the step of detecting an ambient light level executes an if, then/else operation.

Preferably the touch dimmer control method further comprises the step of: detecting movement within the sensing area to execute an if, then/else operation. Preferably the touch dimmer control method further comprises the step of: detecting the proximity of at least one object to execute an if, then/else operation.

Preferably a plurality of successive taps of at least one touch input switches a power state of a light circuit. Advantageously holding a touch input on the touch sensitive surface for a set time duration executes an if, then/else operation. Preferably holding a touch input on the touch sensitive surface for a set time duration executes a preconfigured operation.

Preferably the touch dimmer control method further comprises the step of analysing the data generated by at least one sensor, a device log history or additional input characteristics based on likelihood of occurrence to incrementally learn and predict when to execute an operation. Preferably a user is able to confirm or deny an autonomous operation such that the confirmation or denial is utilised to improve the accuracy of future predictions. Typically the data generated by the at least one sensor, the device log history or the additional input characteristics comprise a home automation system. Preferably the touch dimmer control method further comprises the step of: analysing the data generated by the at least one sensor, the device log history or the additional input characteristics to determine varying means of reducing energy consumption.

The term "light circuit" as employed in this specification refers to one or more lights connected in a single circuit. However, please note, that one lighting device or luminaire may comprise one or more light circuits.

Throughout the specification, unless the context requires otherwise, the word "comprise" or variations such as "comprises" or "comprising", will be understood to imply the inclusion of a stated integer or group of integers but not the exclusion of any other integer or group of integers. Likewise the word "preferably" or variations such as "preferred", will be understood to imply that a stated integer or group of integers is desirable but not essential to the working of the invention.

BRIEF DESCRIPTION OF THE DRAWINGS

The nature of the invention will be better understood from the following detailed description of several specific embodiments of a touch dimmer lighting control system, given by way of example only, with reference to the accompanying drawings, in which.

DETAILED DESCRIPTION OF PREFERRED EMBODIMENTS

A first embodiment of a touch dimmer lighting control system 10 in accordance with the invention, as illustrated in FIGS. 1 to 4, comprises a touch panel device 12 having a touch sensitive surface 14. The touch sensitive surface 14 is capable of detecting movement of a touch input in first and second directions. The touch input detected is typically that provided by a human finger, but may also be a touch input provided by another object. The control system 10 also includes a processor 16 for generating control signals based on this detection. The processor 16 is typically a programmable electronic device, such as a PLC or EEPROM, which controls the logic of the control signals generated according to a preset control program. FIGS. 5 to 9 illustrate in flow chart form a typical control program and control routines employed in the processor 16 for generating the control signals, based on the detected movement of a touch input on the touch sensitive surface 14 and other inputs. The processor 16 may be incorporated within the device 12, or could be provided externally to the device.

Figure 7:
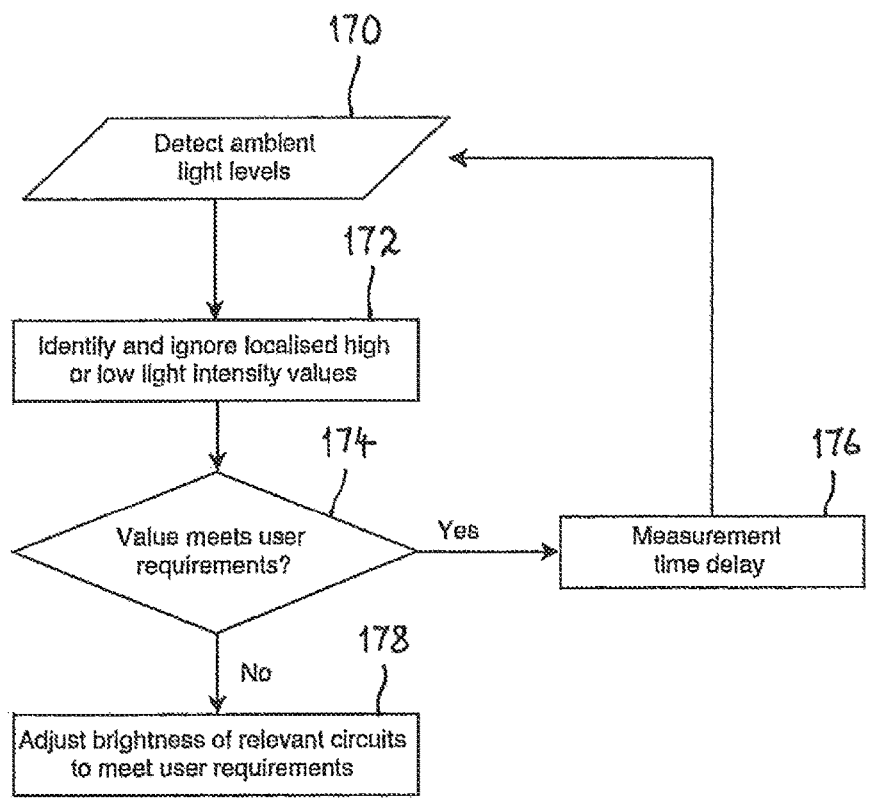
FIG. 7 is a flowchart for a typical control algorithm employed in a processor for the touch panel device of FIG. 2 for autonomously adjusting the brightness based on ambient light level.

Preferably the touch panel device 12 further comprises an ambient light sensor 13 that detects ambient light levels within a sensing area in real time. The light sensor 13 is typically provided on a front face of the touch panel device, adjacent to the touch sensitive surface 14 area, (see also FIG. 4) and is operatively connected to the processor 16 such that the brightness within the sensing area can be adjusted autonomously based on one or more factors to perform an 'if, then, else' operation. FIG. 7 illustrates in flowchart form a typical control algorithm for the processor 16 responsive to the detected ambient light level detected at step 170 by the light sensor 13. The processor 16 is able to identify and ignore localised high or low light intensity levels at step 172, to prevent false measurement of ambient light levels by light sensor 13. At step 174 the system detects whether or not the detected ambient light level is at a value that meets the user requirements. This detection of the ambient light levels by light sensor 13 continues for a period of time, which has been preset as the measurement time delay at step 176. Based on preset occupancy rules, configured according to user requirements, and responsive to the light sensor 13, if the processor 16 detects that the ambient light levels are not at the desired level for a set amount of time (the measurement time delay), then it adjusts the brightness accordingly at step 178.

When the system 10 detects that the ambient light level in the sensing area is above the desired value this algorithm ensures that power consumption of the light circuit is kept to a minimum. When the ambient light level is below the desired value, this algorithm functions as a means of maintaining the desired light levels within the sensing area. Changes in brightness must not be made too frequently to concern the user, and therefore the desired light level is controlled automatically in a manner such that circuit brightness adjustments are carried out at a frequency desirable to the user. The desired light level can be configured to change responsive to multiple factors such as the time of day or other external events communicated to the device wirelessly. For example, the user may require less light in the evening as compared to the morning, due to different tasks. External events may include actions such as turning ON a TV in the sensing area, whereby the device has been configured to dim the lights when the TV is in use.

Preferably the touch panel device 12 further comprises a motion sensor 15 also typically provided on the front face of the touch panel device, adjacent to an active area of the touch sensitive surface 14, that detects movement in the sensing area over a wide angle adjacent to a mounting surface of the device 12. The motion sensor 15 detects movement within the sensing area such that the light circuit state or brightness can be adjusted autonomously responsive to one or more factors. The motion sensor 15 is also operatively connected to the processor 16 such that the brightness within the sensing area can be adjusted autonomously based on one or more factors to perform an 'if, then, else' operation.

Figure 8:
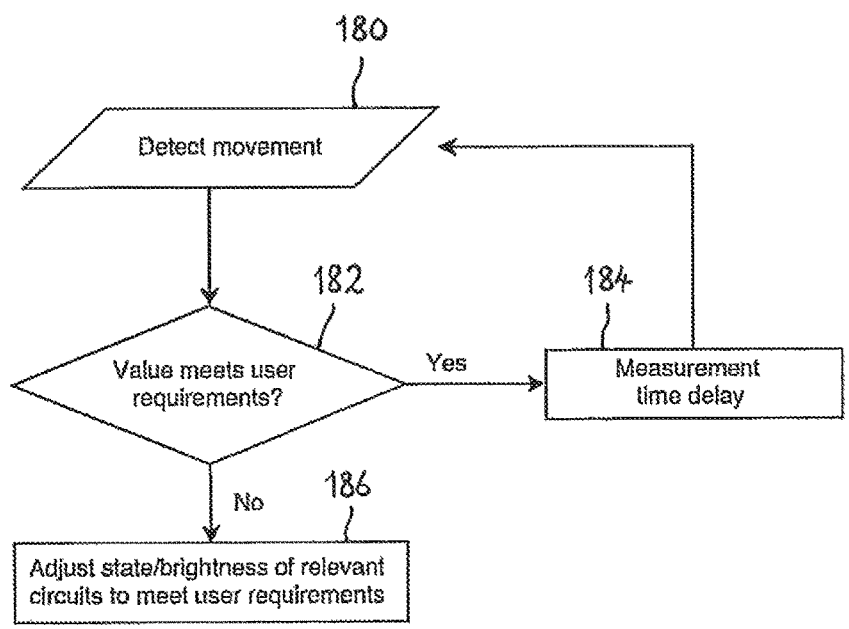
FIG. 8 is a flowchart for a typical control algorithm employed in a processor for the touch panel device of FIG. 2 for autonomously adjusting the state or brightness based on motion.

FIG. 8 illustrates in flowchart form a typical control algorithm for the processor 16 responsive to the movement detected at step 180by the motion sensor 15. At step 182 the system detects whether or not the detected movement is at a value that meets the user requirements. This detection of the movement by motion sensor 15 continues for a period of time, which has been preset as the measurement time delay at step 184. Detected movement can be used as a trigger for maintaining the desired light level based on preset occupancy rules. configured according to user requirements. For example, if the motion sensor detects that an object has entered the sensing space, and the system detects that the ambient light levels are not at the desired level for a set amount of time (the measurement time delay), then it adjusts the brightness accordingly at step 186. As with the light sensor 13, the motion sensor 15 output can be combined with multiple factors to maintain the desired light level within the sensing area.

The motion sensor 15 may be used to detect the number people within the sensing area, their location and their direction of movement. The motion sensor may be used to provide occupancy data for security services. For example if motion is detected within the space and a security alarm is active then a notification can be sent to the security software.

Preferably the touch panel device 12 further comprises a proximity sensor also typically provided on the front face of the touch panel device, adjacent to the active touch area of the touch sensitive surface 14, that detects when a moving object is proximate to the touch panel device. The proximity sensor detects when a moving object is close to the device such that other functions can be enabled as an object approaches the device. For example, one function may be gradually illuminating the touch panel or specific parts of the interface when in a dark environment to facilitate the user locating and operating the device. This minimises standby power, prevents issues associated with undesirable light and provides a human aspect to the device as it is able to respond to the presence of a person.

Advantageously the proximity sensor is integral to the functionality of the motion sensor 15, so as to form a combined motion and proximity sensor 15 and may be, for example, an infra-red motion and proximity sensor.

An image producing apparatus, for example, a video camera, may be included in the touch panel device 12 for remote security monitoring or activity tracking. Preferably the device has a means of emitting infrared light so the video camera is functional in a low light environment. The video camera may be incorporated in the device to replace the ambient light, motion and proximity sensors 13 and 15. This is designed to minimise the complexity of the device, improve robustness and decrease cost.

The touch panel device 12 can control multiple light circuits' power state, brightness and colour temperature and balance separately or simultaneously. To control multiple light circuits the device 12 preferably incorporates a plurality of circuit toggle switches 17 also typically provided on the front face of the touch panel device, in a toggle switch area adjacent to an active touch area of the touch sensitive surface 14 (see FIGS. 1 and 4(*e*)). When a toggle switch 17 is in the active state a corresponding light circuit is controlled by manual inputs on the touch panel, i.e. the toggle switches comprise a channel selection circuit which is used to switch the controlling state of at least one light circuit between an active and an inactive state. In the illustrated embodiment, three toggle switches 17 *a*, 17 *b* and 17 *c* are provided, and the number of light circuits that can be controlled via the channel selection circuit is three. For example, if the $2^{nd}$ and $3^{rd}$ toggle switches 17 *b* and 17 *c* are active, and the user swipes down on the touch sensitive surface 14 the $2^{nd}$ and $3^{rd}$ light circuits dim simultaneously if in the ON power state. In the preferred embodiment these toggle switches use a touch input and are integral with the touch sensitive surface 14 of the touch panel device 12.

The system 10 typically further comprises first and second lighting control means 18 *a* and 18 *b* responsive to the first and second control signals respectively for controlling first and second light circuits respectively. The lighting control means 18 are standard off-the-shelf components for controlling a light fixture. For example, if the light fixture is a downlight with a 12 Volt halogen or compact fluorescent light (CFL) globe, the lighting control system may comprise a transformer for converting the mains power voltage to 12 Volt, and a dimmer for decreasing or increasing the voltage, and hence the power to the globe, to vary the intensity of the light output. The dimmer typically employs a silicon-controlled rectifier or thyristor, rather than a potentiometer or variable resistor, to vary the output power in response to the input control signal.

In the illustrated embodiment first and second light circuits are embodied in a single, dual output light fixture or luminaire 20. The luminaire 20 has first and second light globes, (not visible) and therefore is effectively first and second light circuits in the one light device. Each globe in the luminaire 20 is typically rated at a different colour temperature, for example, one at 3000 k and the other at 5000 k. The 5000 k globe typically produces a much whiter, 'cold' colour temperature light, whereas the 3000 k globe produces a more yellow, 'warm' colour temperature light. In use, the balance of the load between the first and second light circuits and the total light output of both light circuits can be controlled with the same touch panel device 12.

It will be understood that the lighting control system may be used to control two or more light circuits and their corresponding lighting control means. Each light circuit may comprise one or more light globes connected in the one circuit.

Typically the touch sensitive surface 14 is capable of detecting movement of a touch input in first and second perpendicular directions. Advantageously the touch sensitive front surface 14 is capable of detecting movement of a touch input in a horizontal direction (X axis) and a vertical direction (Y axis).

Preferably the first and second control signals generated by the processor 16 are based on a combination of the detected movement of the touch input on the touch sensitive surface 14 in the X and Y directions. Thus, for example, a vertical movement of the touch input in the direction of the Y axis may result in the generation of a first and second control signals that vary the power to both light circuits (and hence the brightness) to exactly the same extent, whereas a horizontal movement of the touch input in the direction of the X axis may result in the generation of first and second control signals that vary the power to the first and second light circuits respectively to a different extent. Movement of the touch input in a diagonal direction would thus result in a combination of these brightness variations in the first and second control signals.

In the illustrated embodiment Output 1 of the touch sensitive device 12 is connected to the first light circuit A which in this case is the 3000 k globe in the luminaire 20, and the Output 2 of the touch sensitive device 12 is connected to the second light circuit B which in this case is the 5000 k globe in the luminaire 20. When the touch sensitive surface 14 is tapped once, as shown in FIG. 3 (*a*), the control signals generated by the device 12 is a simple ON/OFF signal to the respective light control means 18 for switching the globes ON or OFF. processor 16 detects that the signal from the touch surface 14 is a single tap (Step 102 in FIG. 5) and switches the lights ON or OFF accordingly (Step 104 in FIG. 5).

Figure 1:
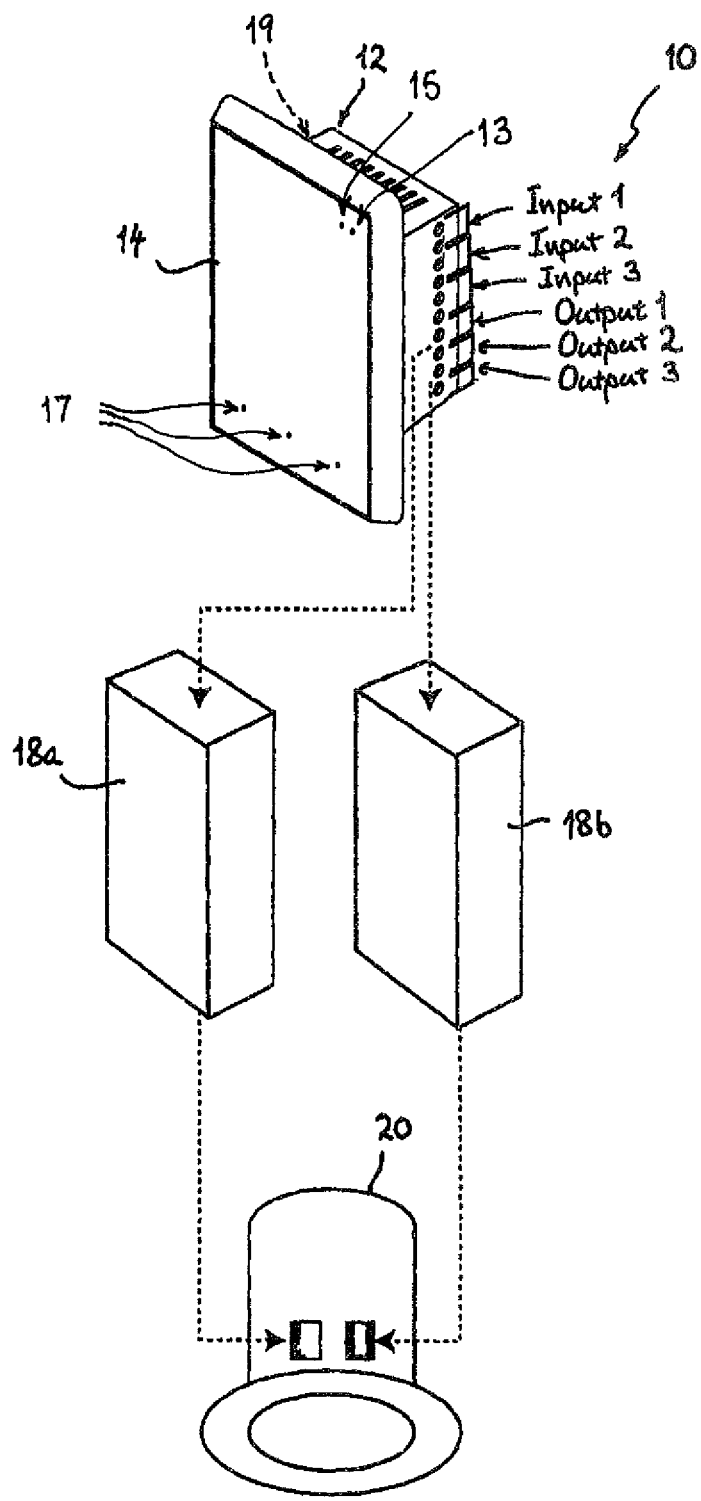
FIG. 1 illustrates a first embodiment of the touch dimmer lighting control system according to the present invention.
Figure 2:
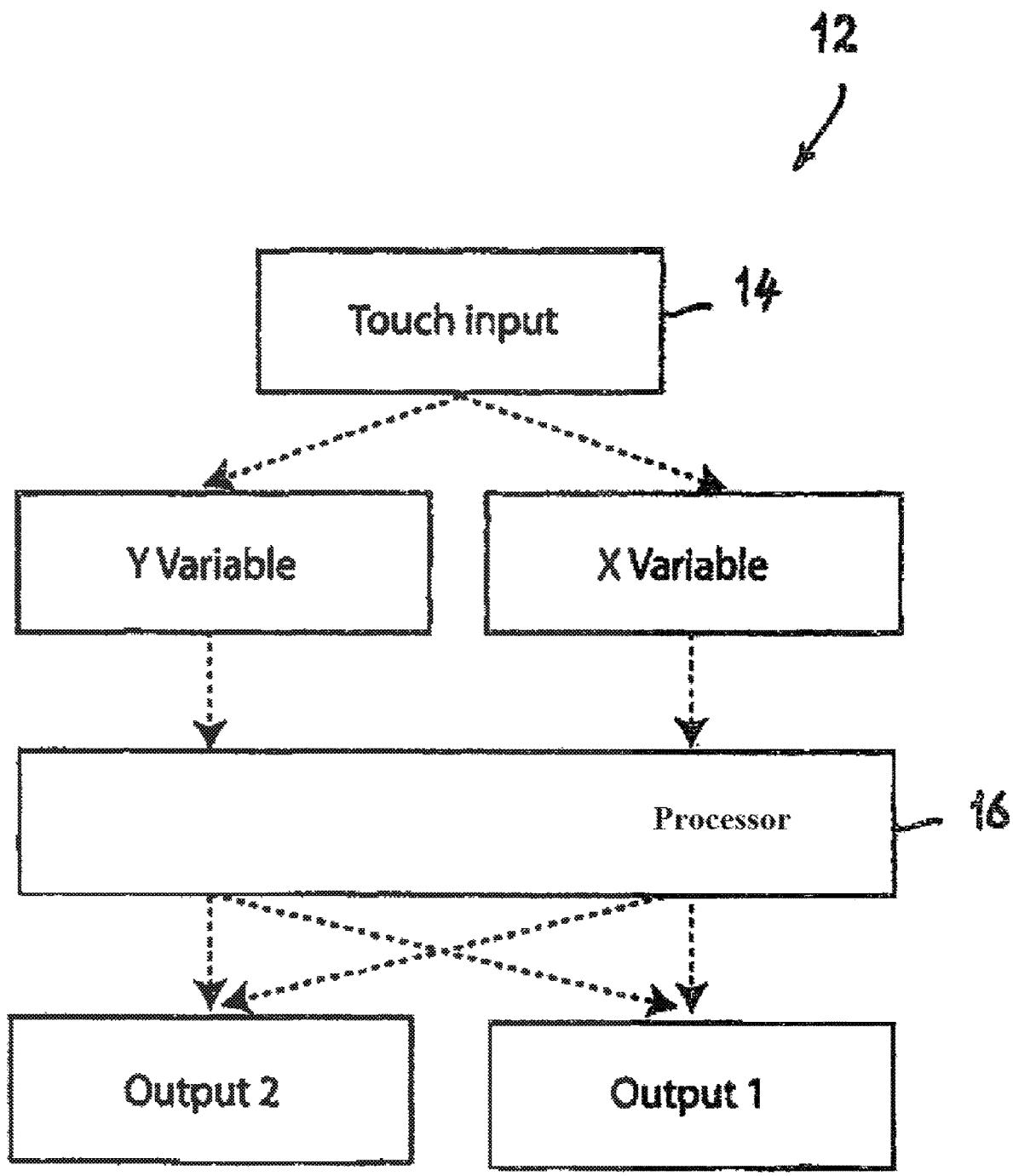
FIG. 2 is a functional block circuit diagram of the touch panel device in the touch dimmer lighting control system of FIG. 1.
Figure 3:
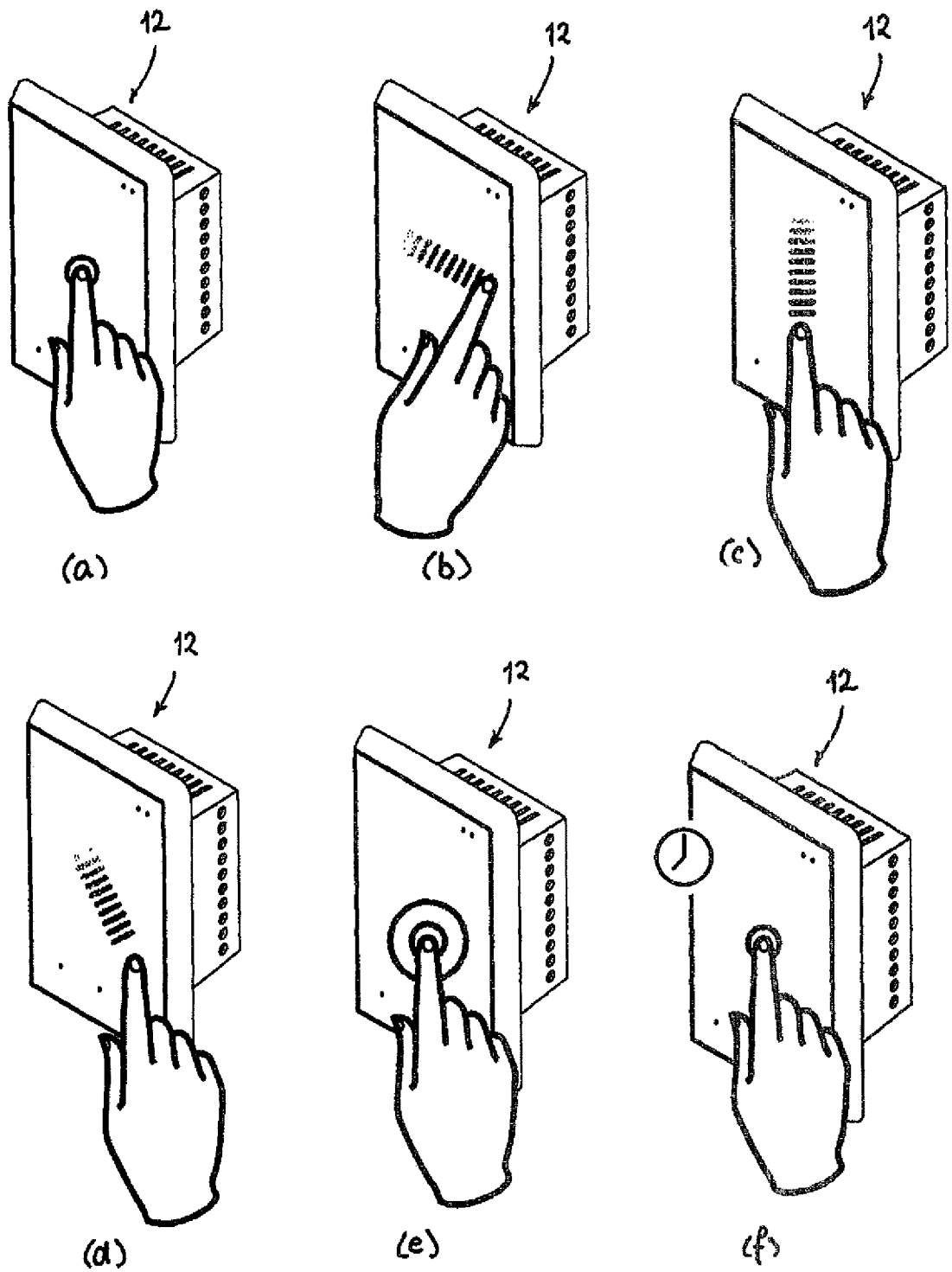
FIGS. 3 (a), (b), (c), (d), (e) and (f) illustrate different control strokes preferably employed with the touch dimmer control system of FIG. 1.
Figure 4:
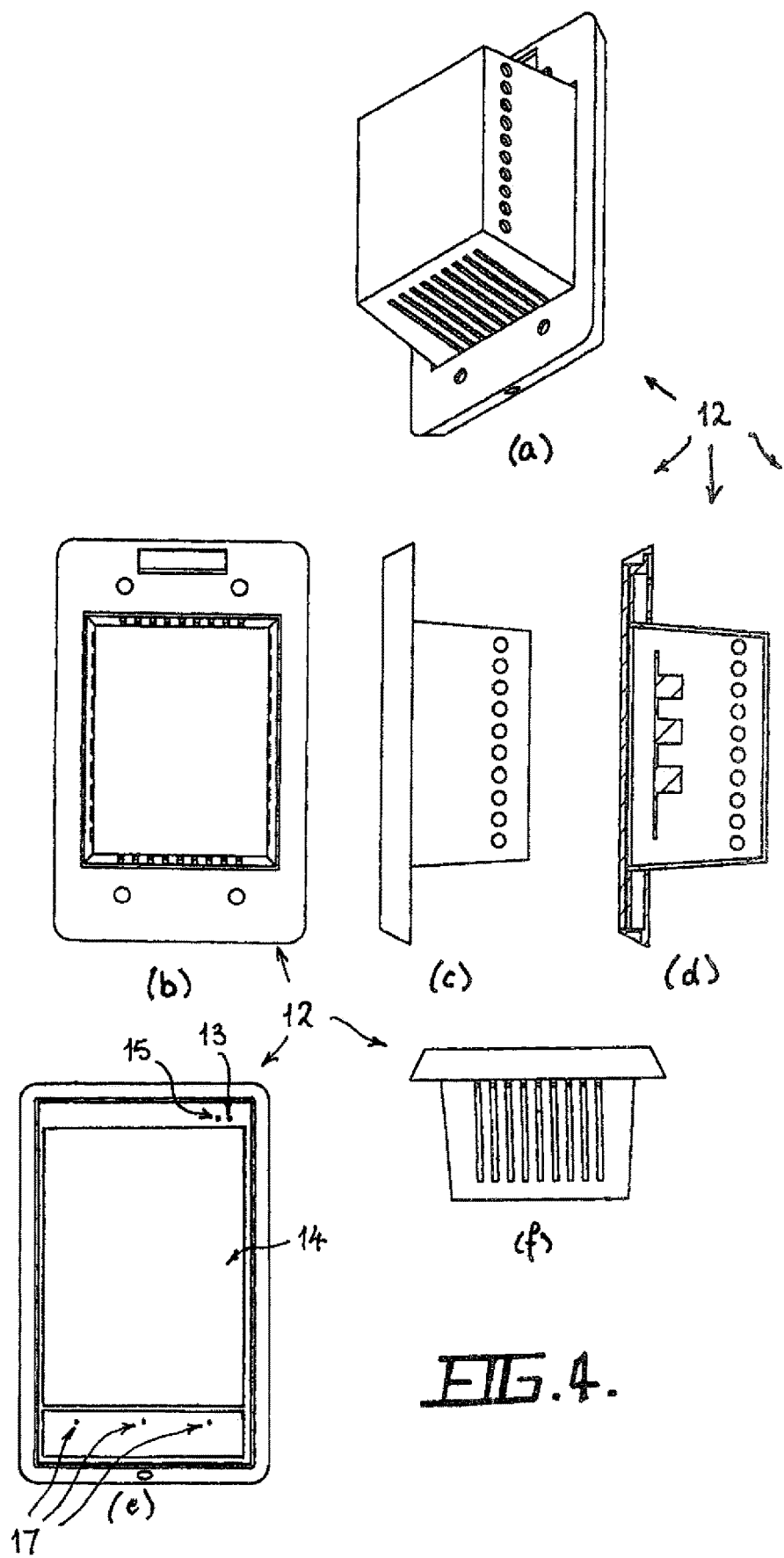
FIGS. 4 (a), (b), (c), (d), (e) and (f) illustrate a preferred embodiment of a touch panel employed in the touch dimmer control system of FIG. 1 in perspective, rear, side, section, front and top plan view respectively.
Figure 5:
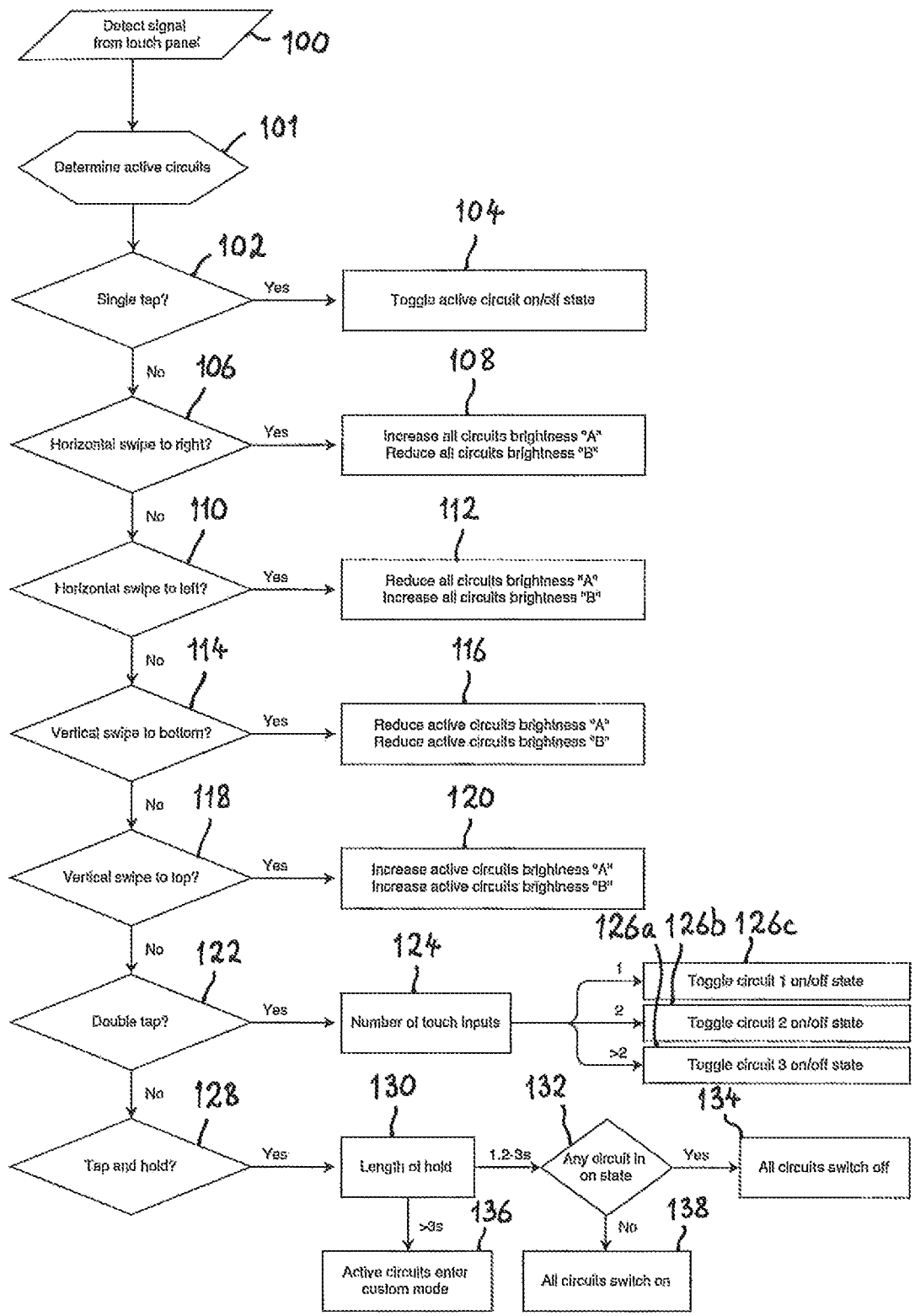
FIG. 5 is a flow chart for a typical control algorithm employed in a processor for the touch panel device of FIG. 2.
Figure 6:
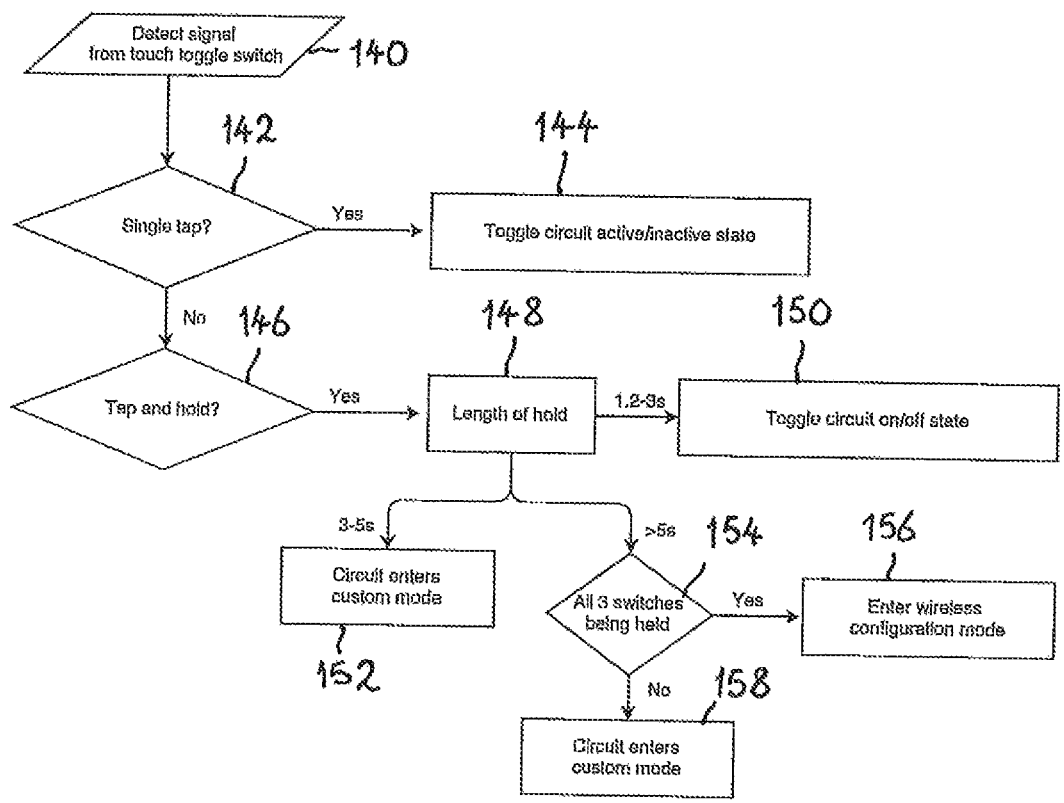
FIG. 6 is a flowchart for manual commands within the toggle switch area of the touch panel device of FIG. 2.

When the touch sensitive surface 14 is swiped with the touch input in a horizontal direction (X axis) from left to right, as shown in FIG. 3(*b*), the processor 16 generates first and second control signals which causes the balance of the load (power output) to move from the first to the second light circuit (3000 k to 5000 k or from warmer to colder colour temperature), as per Steps 106 and 108 in FIG. 5. On the other hand, when the touch sensitive surface 14 is swiped with the touch input in a horizontal direction (X axis) from right to left, the processor 16 generates first and second control signals which causes the balance of the load (power output) to move from the second to the first light circuit (5000 k to 3000 k or from colder to warmer colour temperature), as per Steps 110 and 112 in FIG. 5. The result is a range of colour temperatures between 3000 k to 5000 k.

When the touch sensitive surface 14 is swiped with the touch input in a vertical direction (Y axis) from top to bottom, as shown in FIG. 3(*c*), the processor 16 generates first and second control signals which causes the total power output to both the first and second light circuits (3000 k and 5000 k) to decrease from 100% to 0% brightness, as per Steps 114 and 116 in FIG. 5. On the other hand, when the touch sensitive surface 14 is swiped with the touch input in a vertical direction (Y axis) from bottom to top, the processor 16 generates first and second control signals which causes the total power output to both the first and second light circuits (3000 k and 5000 k) to increase from 0% to 100% brightness, as per Steps 118 and 120 in FIG. 5.

When the touch sensitive surface 14 is swiped with the touch input in a diagonal direction from top left to bottom right, as shown in FIG. 3(*d*), the processor 16 generates first and second control signals which causes both the brightness and the colour temperature of the luminaire 20 to decrease. On the other hand, when the touch sensitive surface 14 is swiped with the touch input in a diagonal direction from top right to bottom left, the processor 16 generates first and second control signals which causes the brightness of the luminaire 20 to decrease and the colour temperature to increase.

The system 10 is also capable of detecting the number of touch inputs for toggling a plurality of light circuits between the ON/OFF state. Thus, for example, if a double tap, as shown in FIG. 3(e), is detected at step 122 in FIG. 5, and if the number of touch inputs is detected at step 124 as "1", i.e. one double tap, then light circuit 1 is toggled ON/OFF at step 126 c. If the number of touch inputs is detected at step 124 as "2", i.e. two double taps, then light circuit 2 is toggled ON/OFF at step 126 b. If the number of touch inputs is detected at step 124 as ">2", e.g. three double taps, then light circuit 3 is toggled ON/OFF at step 126 a.

In addition to detecting touch input movement/distance in the X-Y directions on the touch sensitive surface 14, the system must also be able to detect the time duration a touch input remains stationary on its surface, which is used to control "tap and hold" based functions, as shown in FIG. 3(f). If a "tap and hold" touch input is detected at step 128, then the time duration or length of hold is detected at step 130. The duration must be detected so the system can discern between a short hold (1.2-3 s) and a long hold (>3 s). It is intended a short hold will be used to quickly turn ON or OFF all circuits. Thus if a short hold is detected at step 130, and it is determined at step 132 that any light circuit is in the ON state, then all circuits are switched OFF at step 134. (refer to FIGS. 5 and 6) On the other hand if a long hold is detected at step 130, then all active circuits enter a custom lighting mode which has been preconfigured by the user to meet their requirements.

Multiple light circuits can also be controlled via the toggle switches 17 in the toggle switch area or channel selection circuit. A typical control algorithm for the channel selection circuit is illustrated in FIG. 8. If a signal is detected by the system from a touch toggle switch at step 140, then a type of touch input is determined at steps 142 and 146. If a "single tap" touch input on one of the toggle switches 17 is detected at step 142, then the corresponding light circuit is toggled to the active/inactive state at step 144. If a "tap and hold" touch input on one of the toggle switches 17 is detected at step 146, then the time duration or length of hold is determined at step 148. If the duration detected at step 148 is "short" (1.2-3 s), then the corresponding light circuit is toggled to the active/inactive state at step 150. If the duration determined at step 148 is "long" (>5 s), then the system detects whether or not all three toggle switches 17 are being held at step 154. If "Yes" then the system enters a wireless configuration mode at step 156. If "No" then the system enters a custom mode at step 158. Likewise, if the duration determined at step 148 is "medium" (3-5 s), then the system also enters a custom mode at step 152.

Custom lighting modes can extend across multiple devices, therefore devices must be able to send and receive commands wirelessly. Similar to other commands different custom modes could be entered by the same command ("long" hold) by placing dependence on one or more external inputs such as the time of day or the day of week. For example, the custom mode in the morning on a weekday may be to turn on lights essential to preparing for work in the morning, whilst custom mode in the evening on a Saturday may be to change all lights within common areas of the house to a warm colour temp and dim to 20% for entertaining.

Custom lighting modes may be responsive to a variety of touch inputs, for example: the time difference between a previous tap and a current tap, used for double-tap functions; the location of a touch input such that the same touch panel can be used for both selecting (via toggle switches) and controlling lighting circuits; and, a plurality of simultaneous touch inputs, used for two and three finger functions.

The touch panel device enables a secondary electronic device to control connected circuits (claim 26). This is used for the remote control of lighting for home automation or security services via a web interface or mobile app. This function enables the ability to link a number of devices together via external software (claim 28) which may be used to improve user experience. i.e. from time to time it may be beneficial to have all lights within a building (or portion of) act on single switch wherein every touch device controls all lights. This function may be enacted upon preset rules or events. For example, if the sole occupant is detected to be walking towards the exit of a building the system may link all devices together so they can be turned off with a single action.

Advantageously the touch panel device 12 may also be Bluetooth enabled. The processor 16 may then be designed to interpret a double tap, tap and hold touch input on the touch sensitive surface 14, as shown in FIG. 3(e), to generate a signal to activate a Bluetooth interface in the device 12 for receiving programming instructions from an external Bluetooth enabled device such as an iPhone with an App for setting the time, autorythm, etc. in the device 12. The Bluetooth interface may also be used to provide remote control of the touch panel device 12.

Preferably the touch panel device 12 also has plurality of input and output (see FIG. 1) for connecting the device 12 to alternative external dimming and colour temperature control means such as, for example, an automatic intelligent lighting control system. Such a system may be set to vary the brightness and colour temperature of the lights according to the natural circadian rhythm, the season and the time of day.

Preferably the touch panel device 12 further comprises a wireless communications module and antenna 19, (not visible in FIG. 1) operatively connected to the processor 16 for receiving and transmitting data on a wireless network wherein, in use, the device can be connected to a central HUB for home automation and/or can be used as a wireless repeater. The wireless communications module and antenna 19 are used to receive and transmit data on a wireless network such that sensor outputs and external inputs can be used to adjust the circuit state, brightness and colour temperature autonomously. The device 12 is able to receive the security credentials related to a wireless network without the need for a display on the touch panel. In the preferred embodiment the device is configured for the WiFi protocol. In this embodiment the device can also be configured to act as a wireless repeater to extend the range of a WiFi network as per user requirements (all the devices 12 have this capability however, only a limited number will have it activated to prevent unnecessary interference on the network).

Figure 9:
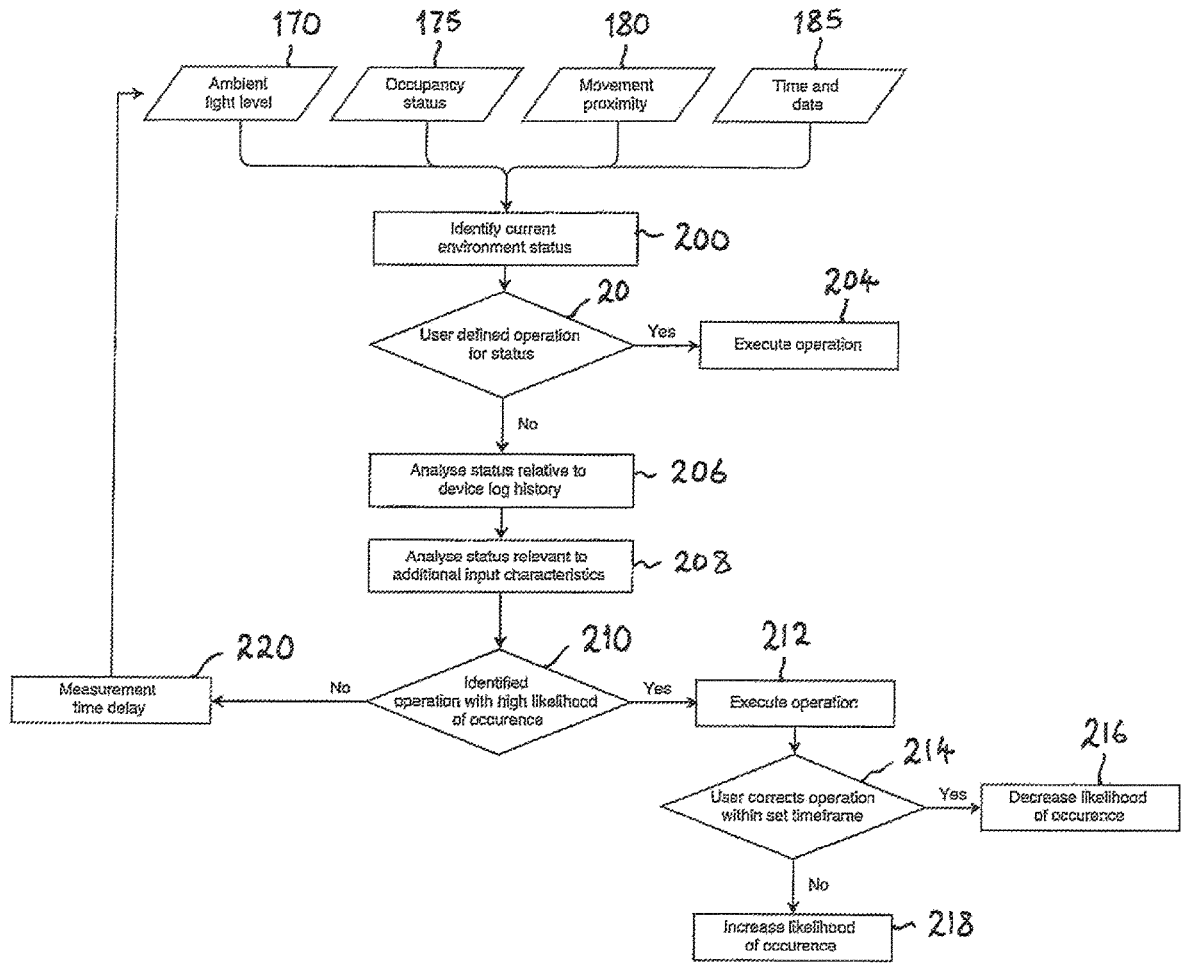
FIG. 9 is a flowchart for a typical control algorithm employed in a processor for the touch panel device of FIG. 2 for predicting when to execute an operation and improving predictive accuracy; and, FIG. 10 is a flowchart for a typical control algorithm employed in a processor for a second embodiment of a touch panel device in the touch dimmer lighting control system according to the invention.

Advantageously the touch dimmer lighting control system and method comprises an algorithm for analysing data generated by at least one sensor, a device log history or additional input characteristics based on likelihood of occurrence, to enable the software to incrementally learn and predict when to execute an operation. FIG. 9 illustrates in flowchart form an algorithm for predicting when to execute an operation and improve predictive accuracy. Sensor data refers to real time data collected from the light, motion and proximity sensors or video camera (steps 170, 175, 180, etc.) to identify the current environment status at step 200.

Incremental learning takes place when the system 10 identifies a moment in which the user is likely to input a command due to the current environment status and executes an action which is corrected by the user within a given timeframe, detected at step 220. If it is detected at step 201 that there is a user defined operation that matches the current environment status, identified at step 200, then the operation is executed at step 204. If it is detected at step 201 that there is no user defined operation that matches the current environment status, then the current environment status is analysed at step 206 relative to the log history. Device log history refers to a record of how the device 12 has been used in the past. This log history data can be analysed with reference to the current environment status, time of day, day of week, season etc. (step 185) to identify the likelihood of the user inputting a specific command. The current environment status is also analysed at step 208 as it relates to additional input characteristics. Additional input characteristics may include rules, triggers, corrections or any other data that has been inputted by the user to improve the device predictions.

Based on these analyses the system tries to identify whether or not the operation has a high likelihood of occurrence at step 210. If the system identifies the operation as having a high likelihood of occurrence, then it proceeds to execute the operation at step 212. The user has the opportunity to correct the operation within a set timeframe. If the system detects at step 214 that the user has made a correction within the set timeframe, then the system recognises and records at step 216 that this operation was incorrect and therefore has decreased likelihood of occurrence should the same environment status currently identified reoccur in the future.

On the other hand, if the system detects at step 214 that the user did not make a correction within the set timeframe, then the system recognises and records at step 216 that this operation was correct and therefore has increased likelihood of occurrence should the same environment status currently identified reoccur in the future. If the prediction is deemed correct it may be recorded as the correct action for the current environment status and conducted in the future. If incorrect it helps improve the accuracy of future predictions. This should not be considered an absolute confirmation/rejection of the prediction.

It is intended the touch dimmer lighting control system will be used in a more comprehensive system for home automation or security monitoring. Within these systems the data collected will be analysed with additional information from other subsystems by a secondary device to determine the correct operation. Similarly, it is intended the system will be used either by itself or in a more comprehensive system to analyse energy consumption and execute automated predictions to minimise energy use within the building.

Figure 10:
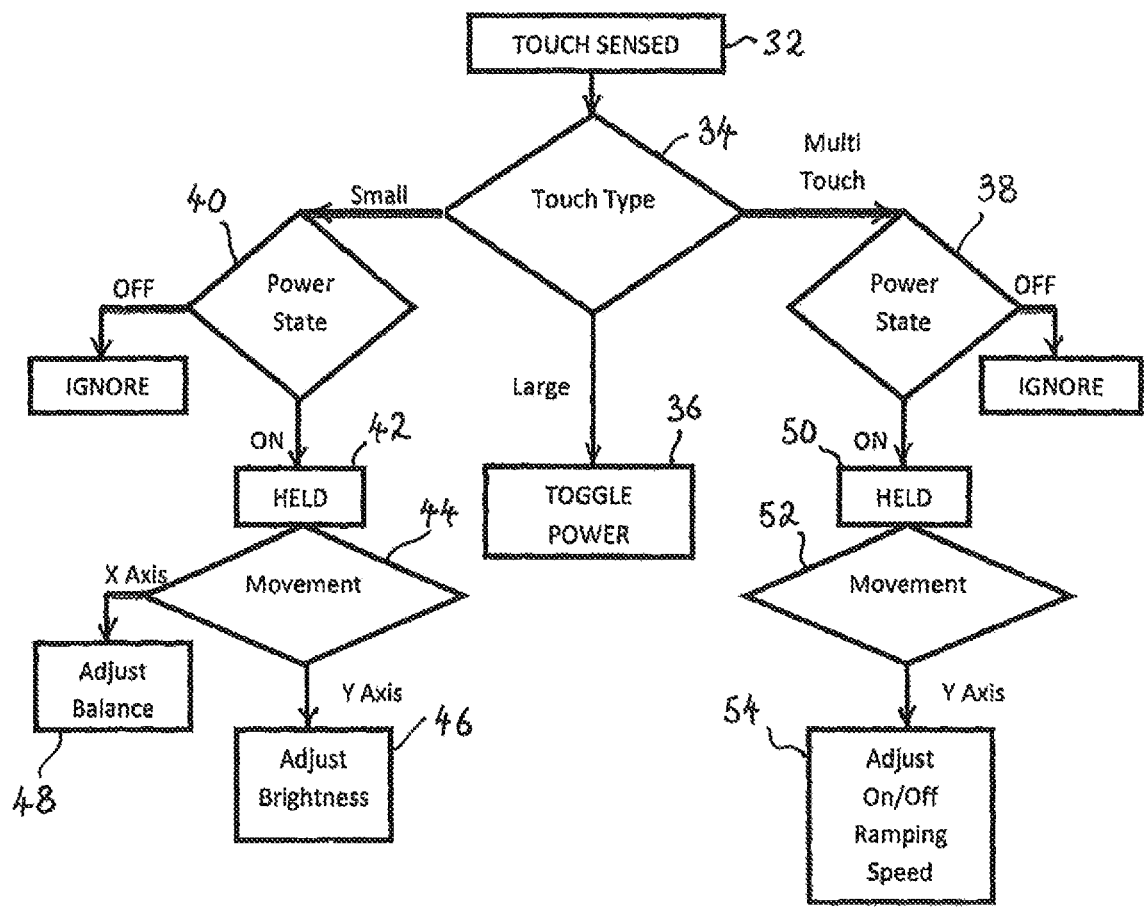

Further variations to the invention are envisaged including variations as to the action of touching the touch panel of the touch panel device so as to produce differing lighting effects. FIG. 10 is a flowchart for a typical control algorithm employed in a processor for a second embodiment of a touch panel device in a touch dimmer lighting control system in accordance with the invention. After a touch input is sensed at step 32 the type of touch input is determined at step 34. The touch panel device and the touch sensitive surface of this embodiment are similar in design to that of the touch panel device 12 and the touch sensitive surface 14. Additional settings may be provided which are activated from the touch panel by providing different types of touch input to the touch sensitive surface. If it is detected at step 34 that the touch input is a "Small" touch, for example, by touching the touch sensitive surface with a light touch, the processor first detects the power state of the touch dimmer lighting control system at step 40. If the system is in the "OFF" state, the touch input is ignored.

On the other hand, if the system is in the "ON" state, and the touch input is held at step 42 followed by a movement detected at step 44 in the vertical direction (Y axis), then the brightness is adjusted at step 46. If the movement detected at step 44 is in the horizontal direction (X axis), then the colour balance is adjusted at step 48. If the touch input is released for more than a set duration, the change mode is exited.

If it is detected at step 34 that the touch input is a "Multi Touch" touch, for example, by touching the touch sensitive surface with two or more fingers, the processor first detects the power state of the touch dimmer lighting control system at step 38. If the system is in the "OFF" state, the touch input is ignored. On the other hand, if the system is in the "ON" state, and the touch input is held at step 50 followed by a movement detected at step 52 in the vertical direction (Y axis), then the ON/OFF ramping speed is adjusted at step 54.

If it is detected at step 34 that the touch input is a "Large" touch, for example, by touching the touch sensitive surface with a heavy touch, the processor simply toggles the power state of the touch dimmer lighting control system at step 36, with no change to settings.

Now that preferred embodiments of the dimmer lighting control system and method and a touch panel device have been described in detail, it will be apparent that the described embodiments provide a number of advantages over the prior art, including the following:
 (i) A single touch panel device can replace multiple prior art mechanical switches and rotary dimmers for controlling a plurality of light circuits.
 (ii) Both brightness and colour temperature can be controlled with a single touch panel device.
 (iii) An infinite variety of combinations of brightness and colour temperature can be achieved with a simple touch control.
 (iv) By varying the way in which the finger or fingers press the touch panel device, different effects can be achieved, for example in lighting brightness and colour balance.

It will be readily apparent to persons skilled in the relevant arts that various modifications and improvements may be made to the foregoing embodiments, in addition to those already described, without departing from the basic inventive concepts of the present invention. For example, whilst the touch panel device of the illustrated embodiment is a stand-alone lighting control device, it could also be integrated into the software and touch screen of an intelligent building control system used for controlling climate, lighting, security, AN and other electrical systems in a building. Therefore, it will be appreciated that the scope of the invention is not limited to the specific embodiments described.

The invention claimed is:
1. A touch panel device for issuing a control signal to a dimmer lighting control system of a luminaire, the device comprising:
 a touch sensitive surface configured for detecting one or more touch inputs;
 a light sensor configured for detecting a level of ambient light;
 a motion sensor configured for sensing a movement of a body in a space surrounding the device; and
 a processor operatively connected to the touch sensitive surface, the light sensor, and the motion sensor, and wherein the processor is configured for generating the control signal based on the detected one or more touch inputs, the detected level of ambient light, and the sensed movement; wherein the processor is further operatively and remotely connected to a secondary device through a wireless network, and wherein, the processor is further configured for:

transmitting an output data for storing in the secondary device as a historical data, wherein the output data is detected from the touch sensitive surface and at least one of the light sensor and the motion sensor;

learning from the stored historical data, wherein the learning is utilized for generation of a modified control signal; wherein based on the modified control signal and a user input, the processor is further configured for:

receiving the user input through the touch sensitive surface signifying an acceptance to confirm device operation based on the modified control signal or signifying a rejection to deny the device operation and forming a new operation for further modifying the control signal, and transmitting for storing the information of the acceptance and the rejection in the secondary device as the historical data.

2. The touch panel device as claimed in claim 1, further comprising: a wireless communication module and an antenna operatively connected to the processor for communicating with a central hub for home automation.

3. The touch panel device as claimed in claim 1, further comprising an image producing apparatus operatively connected to the processor.

4. The touch panel device as claimed in claim 1, wherein the touch sensitive surface is configured for detecting the one or more touch inputs in a first direction and a second direction.

5. The touch panel device as claimed in claim 4, wherein, the control signal generated by the processor is based on a combination of the one or more touch inputs detected in the first direction and the second direction on the touch sensitive surface.

6. The touch panel device as claimed in claim 1, further comprising a channel selection circuit for switching a controlling state of luminaire between an active and an inactive state.

7. A method for controlling a light circuit, the method comprising:

detecting one or more of:
  a touch input on a touch sensitive surface of a touch panel device;
  a level of ambient light; and
  a movement of a body sensed in a space surrounding the touch panel device;

generating a control signal based on one or more detection of the touch input, the level of ambient light and the sensed movement for controlling a total light output of the light circuit to achieve a desired light level in the sensing area;

transmitting an output data for storing in a secondary device as a historical data, wherein the output data is detected from the one or more detection of the touch input, the level of ambient light and the sensed movement from the touch panel device;

learning from the stored historical data, wherein the learning is utilized for generation of a modified control signal;

receiving a user input through the touch sensitive surface signifying an acceptance to confirm device operation based on the modified control signal or signifying a rejection to deny the device operation and forming a new operation for further modifying the control signal;

storing the information of the acceptance and the rejection in the secondary device as the historical data, wherein the method further comprises linking a plurality of like touch panel devices through the secondary device such that the linked touch panel devices control one or more light circuits as a single circuit.

8. The method as claimed in claim 7, further comprising detecting a time duration for which the touch input remains stationary on the touch sensitive surface.

9. The method as claimed in claim 7, further comprising detecting a time difference between a previous tap and a current tap of the touch input on the touch sensitive surface.

10. The method as claimed in claim 7, wherein the desired light level is controlled automatically, by the control signal, in a manner such that the light circuit brightness adjustments are carried out at a frequency desirable to a user.

11. The method as claimed in claim 7, wherein a plurality of successive taps of at least one touch input switches a power state of the light circuit.

12. The method as claimed in claim 7, wherein holding the touch input on the touch sensitive surface for a set time duration executes a preconfigured operation.

13. The method as claimed in claim 7, further comprising analysing the data generated by at least one sensor in the secondary device, a device log history or additional input characteristics based on likelihood of occurrence to incrementally learn and predict when to execute an operation.

14. The method as claimed in claim 7, wherein a user is able to confirm or deny an autonomous operation such that the confirmation or denial is utilised to improve the accuracy of future predictions.

\* \* \* \* \*